US007095282B2

(12) United States Patent
Barabash (10) Patent No.: US 7,095,282 B2
(45) Date of Patent: Aug. 22, 2006

(54) TEMPERATURE COMPENSATING CIRCUIT

(75) Inventor: Darrell Barabash, Grapevine, TX (US)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 11/027,684

(22) Filed: Jan. 3, 2005

(65) Prior Publication Data

US 2005/0200419 A1  Sep. 15, 2005

Related U.S. Application Data

(63) Continuation-in-part of application No. 10/795,447, filed on Mar. 9, 2004.

(51) Int. Cl.
*H03F 3/04* (2006.01)
(52) U.S. Cl. ...................... 330/289; 330/296
(58) Field of Classification Search ................ 330/289, 330/296
See application file for complete search history.

(56) References Cited

U.S. PATENT DOCUMENTS

| 3,430,076 A | | 2/1969 | Overtveld | |
| 3,758,791 A | * | 9/1973 | Taniguchi et al. | 326/33 |
| 4,017,788 A | * | 4/1977 | Stepp et al. | 323/226 |
| 4,521,742 A | * | 6/1985 | Edvardsen | 330/289 |
| 4,555,675 A | * | 11/1985 | Blanchandin et al. | 330/289 |
| 6,091,279 A | | 7/2000 | Hamparian | |
| 6,452,454 B1 | * | 9/2002 | Shapiro et al. | 330/289 |
| 6,879,214 B1 | * | 4/2005 | LeSage et al. | 330/289 |

FOREIGN PATENT DOCUMENTS

| EP | 1 081 573 A1 | 3/2001 |
| WO | WO 00/44089 | 7/2000 |

* cited by examiner

*Primary Examiner*—Patricia Nguyen
(74) *Attorney, Agent, or Firm*—Squire, Sanders & Dempsey LLP (57) ABSTRACT

The invention relates to a temperature compensating circuit for an amplifier. The circuit comprises a voltage regulator, a component arrangement and a resistor coupling of at least two resistor units. At least part of the output voltage of the temperature compensating circuit is adjustable. The component arrangement includes at least one component with a known temperature dependency of voltage. The resistor coupling forms a slope coefficient as a ratio of values of the resistors in the resistor coupling. The resistor coupling is coupled to the a component arrangement in order to provide the temperature compensating circuit with an output voltage having a temperature dependency which is a function of the slope coefficient and the known temperature dependency of the component arrangement.

12 Claims, 5 Drawing Sheets

TEMPERATURE COMPENSATING CIRCUIT

This is a Continuation-in-Part of application Ser. No. 10/795,447 filed Mar. 9, 2004. The disclosure of the prior application is hereby incorporated by reference herein in its entirety.

FIELD

The invention relates to temperature compensation of a bias voltage of an amplifier.

BACKGROUND

Temperature compensation of a bias voltage of an amplifier is important because the amplifier is usually sensitive to changes in voltage of a power source. This is particularly important with the RF power amplifiers, such as LDMOS (Laterally Diffused Metal Oxide Semiconductor) devices, which are used for example in base stations of a radio system.

When a base station is located outdoors, the output voltage of a power source drifts with temperature, the variation of which can be very large causing a large variation in amplification. In prior art the temperature compensation has been performed, for example, by using a sensor and a microcontroller such that the microcontroller with a predetermined control algorithm controls the bias voltage provided by the temperature compensation circuit based on the temperature sensed by the sensor. This kind of solution is very complicated and expensive and requires a total circuit board area of tens of square centimetres.

The patent publication U.S. Pat. No. 6,091,279 presents a simpler temperature compensation circuit which includes a temperature dependent component having a 2 mV/° C. temperature offsetting characteristic. With the temperature dependent component the circuit exhibits a constant slope of −2 mV/° C. as temperature changes. However, this solution has disadvantages. Since the slope is constant, the solution cannot be utilized if the need for compensation is different from the constant value.

BRIEF DESCRIPTION OF THE INVENTION

An object of the invention is to provide an improved temperature compensating circuit. According to an aspect of the invention, there is provided a temperature compensating circuit for an amplifier, the circuit comprising a voltage regulator having at least three terminals, a voltage between a first pair of terminals being adjustable and a reference voltage between a second pair of terminals being thermally stable, and at least part of the output voltage of the temperature compensating circuit being provided from the first pair of terminals; a component arrangement including at least one component with a known temperature dependency of voltage, the at least one component with a known temperature dependency being coupled between the first pair of terminals of the voltage regulator; a resistor coupling of at least two resistor units for forming a slope coefficient as a ratio of values of the resistors in the resistor coupling, each of the resistor units including at least one resistor, and the resistor coupling is coupled to the at least one component having a known temperature dependency and being coupled between the first pair of terminals of the voltage regulator for providing the temperature compensating circuit with an output voltage having a temperature dependency which is a function of the slope coefficient and the known temperature dependency of the at least one component in the component arrangement.

According to another aspect of the invention, there is provided a temperature compensating circuit for an amplifier, the circuit comprising means for regulating voltage, the means for regulating voltage having at least three terminals, a voltage between a first pair of terminals being adjustable and a reference voltage between a second pair of terminals being thermally stable, and at least part of the output voltage of the temperature compensating circuit being provided from the first pair of terminals; means for providing a known temperature dependency; means for forming a slope coefficient; and the circuit is configured to provide an output voltage having a temperature dependency which is a function of the slope coefficient and the known temperature dependency.

According to another aspect of the invention, there is provided a temperature compensating circuit for an amplifier, the circuit comprising a voltage regulator having at least three terminals, a voltage between a first pair of terminals being adjustable and a reference voltage between a second pair of terminals being thermally stable, and at least part of the output voltage of the temperature compensating circuit being the voltage from the first pair of terminals; a component arrangement including at least one diode with a known temperature dependency of voltage, the at least one diode with a known temperature dependency being forward biased between the first pair of terminals of the voltage regulator; a resistor coupling of at least two resistors for forming a slope coefficient as a ratio of values of the resistors in the resistor coupling, the at least one diode with a known temperature dependency being coupled in series with a series resistor, and the series coupling of the component arrangement and the series resistor being coupled in parallel with a parallel resistor, the parallel resistor and the series resistor being the resistors of the resistor coupling; and the resistor coupling is coupled to the at least one diode having a known temperature dependency and being coupled between the first pair of terminals of the voltage regulator for providing the temperature compensating circuit with an output voltage having a temperature dependency which is a function of the slope coefficient and the known temperature dependency of the at least one diode in the component arrangement.

According to another aspect of the invention, there is provided an amplifier including a temperature compensating circuit, the temperature compensating circuit comprising a voltage regulator having at least three terminals, a voltage between a first pair of terminals being adjustable and a reference voltage between a second pair of terminals being thermally stable, and at least part of the output voltage of the temperature compensating circuit being provided from the first pair of terminals; a component arrangement including at least one component with a known temperature dependency of voltage, the at least one component with a known temperature dependency being coupled between the first pair of terminals of the voltage regulator; a resistor coupling of at least two resistor units for forming a slope coefficient as a ratio of values of the resistors in the resistor coupling, each of the resistor units including at least one resistor, and the resistor coupling is coupled to the at least one component having a known temperature dependency and being coupled between the first pair of terminals of the voltage regulator for providing the temperature compensating circuit with an output voltage having a temperature dependency which is a function of the slope coefficient and the known temperature dependency of the at least one component in the component arrangement.

According to another aspect of the invention, there is provided a transmitter including an amplifier with a temperature compensating circuit, the temperature compensating circuit of the transmitter comprising a voltage regulator having at least three terminals, a voltage between a first pair of terminals being adjustable and a reference voltage between a second pair of terminals being thermally stable, and at least part of the output voltage of the temperature compensating circuit being provided from the first pair of terminals; a component arrangement including at least one component with a known temperature dependency of voltage, the at least one component with a known temperature dependency being coupled between the first pair of terminals of the voltage regulator; a resistor coupling of at least two resistor units for forming a slope coefficient as a ratio of values of the resistors in the resistor coupling, each of the resistor units including at least one resistor, and the resistor coupling is coupled to the at least one component having a known temperature dependency and being coupled between the first pair of terminals of the voltage regulator for providing the temperature compensating circuit with an output voltage having a temperature dependency which is a function of the slope coefficient and the known temperature dependency of the at least one component in the component arrangement.

According to another aspect of the invention, there is provided a base station including an amplifier with a temperature compensating circuit, the temperature compensating circuit of the transmitter comprising a voltage regulator having at least three terminals, a voltage between a first pair of terminals being adjustable and a reference voltage between a second pair of terminals being thermally stable, and at least part of the output voltage of the temperature compensating circuit being provided from the first pair of terminals; a component arrangement including at least one component with a known temperature dependency of voltage, the at least one component with a known temperature dependency being coupled between the first pair of terminals of the voltage regulator; a resistor coupling of at least two resistor units for forming a slope coefficient as a ratio of values of the resistors in the resistor coupling, each of the resistor units including at least one resistor, and the resistor coupling is coupled to the at least one component having a known temperature dependency and being coupled between the first pair of terminals of the voltage regulator for providing the temperature compensating circuit with an output voltage having a temperature dependency which is a function of the slope coefficient and the known temperature dependency of the at least one component in the component arrangement.

According to another aspect of the invention, there is provided a user terminal including an amplifier with a temperature compensating circuit, the temperature compensating circuit of the transmitter comprising a voltage regulator having at least three terminals, a voltage between a first pair of terminals being adjustable and a reference voltage between a second pair of terminals being thermally stable, and at least part of the output voltage of the temperature compensating circuit being provided from the first pair of terminals; a component arrangement including at least one component with a known temperature dependency of voltage, the at least one component with a known temperature dependency being coupled between the first pair of terminals of the voltage regulator; a resistor coupling of at least two resistor units for forming a slope coefficient as a ratio of values of the resistors in the resistor coupling, each of the resistor units including at least one resistor, and the resistor coupling is coupled to the at least one component having a known temperature dependency and being coupled between the first pair of terminals of the voltage regulator for providing the temperature compensating circuit with an output voltage having a temperature dependency which is a function of the slope coefficient and the known temperature dependency of the at least one component in the component arrangement.

According to another aspect of the invention, there is provided an amplifier including a temperature compensating circuit, the temperature compensating circuit comprising means for regulating voltage having at least three terminals, a voltage between a first pair of terminals being adjustable and a reference voltage between a second pair of terminals being thermally stable, and at least part of the output voltage of the temperature compensating circuit being provided from the first pair of terminals; means for providing a known temperature dependency; means for forming a slope coefficient; and the circuit is configured to provide an output voltage having a temperature dependency which is a function of the slope coefficient and the known temperature dependency.

According to another aspect of the invention, there is provided a transmitter including an amplifier with a temperature compensating circuit, the temperature compensating circuit of the transmitter comprising means for regulating voltage, the means for regulating voltage having at least three terminals, a voltage between a first pair of terminals being adjustable and a reference voltage between a second pair of terminals being thermally stable, and at least part of the output voltage of the temperature compensating circuit being provided from the first pair of terminals; means for providing a known temperature dependency; means for forming a slope coefficient; and the temperature compensating circuit is configured to provide an output voltage having a temperature dependency which is a function of the slope coefficient and the known temperature dependency.

According to another aspect of the invention, there is provided a base station including an amplifier with a temperature compensating circuit, the temperature compensating circuit of the transmitter comprising means for regulating voltage, the means for regulating voltage having at least three terminals, a voltage between a first pair of terminals being adjustable and a reference voltage between a second pair of terminals being thermally stable, and at least part of the output voltage of the temperature compensating circuit being provided from the first pair of terminals; means for providing a known temperature dependency; means for forming a slope coefficient; and the temperature compensating circuit is configured to provide an output voltage having a temperature dependency which is a function of the slope coefficient and the known temperature dependency.

According to another aspect of the invention, there is provided a user terminal including an amplifier with a temperature compensating circuit, the temperature compensating circuit of the transmitter comprising means for regulating voltage, the means for regulating voltage having at least three terminals, a voltage between a first pair of terminals being adjustable and a reference voltage between a second pair of terminals being thermally stable, and at least part of the output voltage of the temperature compensating circuit being provided from the first pair of terminals; means for providing a known temperature dependency; means for forming a slope coefficient; and the temperature compensating circuit is configured to provide an output voltage having a temperature dependency which is a function of the slope coefficient and the known temperature dependency.

Preferred embodiments of the invention are described in the dependent claims.

The method and system of the invention provide several advantages. In a preferred embodiment of the invention the temperature slope can be determined as a ratio of resistors and can be arbitrary in magnitude. The slope can be predetermined for the amplifying component and adjusted in production by a proper resistor selection. Furthermore, the slope is independent of the nominal voltage setting thus facilitating production alignment.

LIST OF DRAWINGS

In the following, the invention will be described in greater detail with reference to the preferred embodiments and the accompanying drawings, in which.

DESCRIPTION OF EMBODIMENTS

The present solution is especially suitable for compensating changes in the device characteristics of a transistor in a power amplifier of a transmitter of a base station or a user terminal operating at radio frequencies without, however, being limited to it.

Figure 1A:
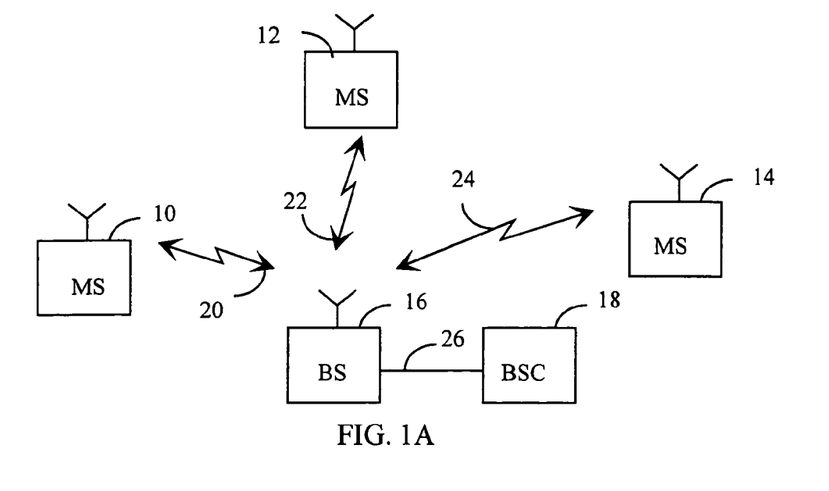
FIG. 1A shows a radio system.

First the radio system is described by means of FIG. 1. A typical digital radio system comprises subscriber equipment 10 to 14, at least one base station 16, and a base station controller 18, which can also be called a radio network controller. The subscriber equipment 10 to 14 communicates with the base station 16 using signals 20 to 24. The base station 16 can be connected to the base station controller 18 by a digital transmission link 26. The subscriber equipments 10 to 14 may be fixedly installed terminals, user equipment installed in a vehicle or portable mobile terminals. The signals 20 to 24 between the subscriber equipment 10 to 14 and the base station 16 carry digitised information, which is e.g. speech, data information or control information produced by subscribers or by other elements in the radio system.

Figure 1B:
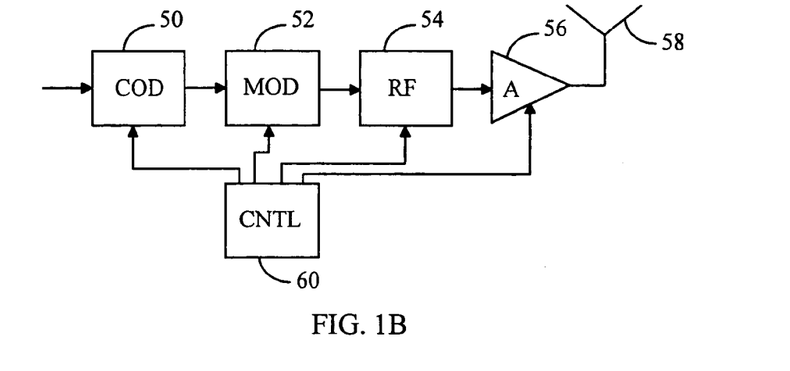
FIG. 1B shows a transmitter.

FIG. 1B shows a transmitter. The transmitter may include an encoder 50 to code an input signal (or many input signals), a modulator 52 to modulate and possibly to spread the signal, a mixer 54 to mix the signal with a carrier having a desired radio frequency, a power amplifier 56 to amplify the signal to a desired extent, an antenna 58 to transmit the RF signal as electromagnetic radiation, and a controller 60 to control the blocks 50 to 56. Particularly, the controller 60 may be used to control the slope of the temperature compensating circuit.

Figure 2A:
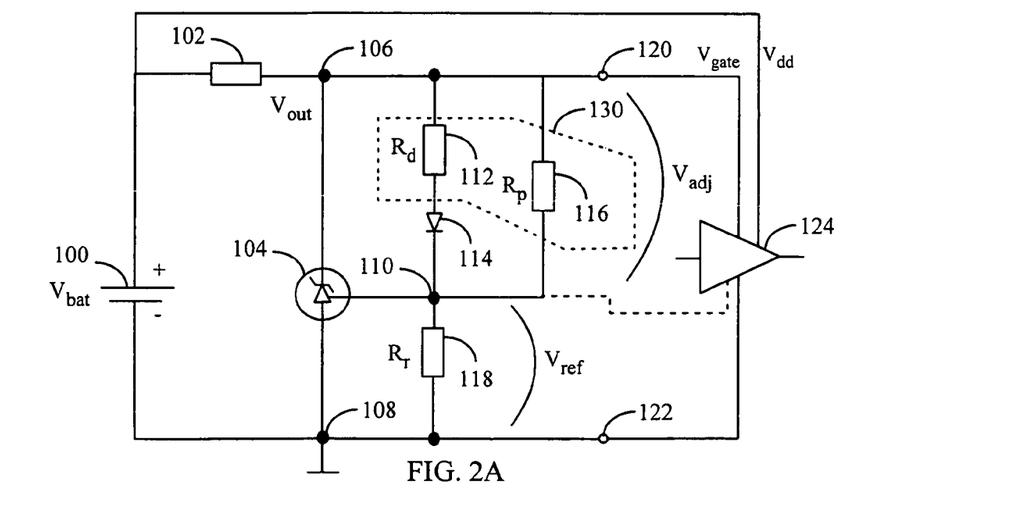
FIG. 2A shows an embodiment of a temperature compensating circuit.

With reference to FIG. 2A, consider an example of a temperature compensating circuit. A battery or any other DC (Direct Current) power source 100 may provide a constant voltage to the circuit. A source resistor unit $R_s$ 102 can be an internal resistor of the power source 100, but it may also represent a combination of an internal resistor and an external resistor. A voltage regulator 104, such as a programmable precision shunt regulator TL431 or the like, may be coupled between the source resistor 102 and a negative terminal of the power source 100.

The voltage regulator 106 may have three terminals 106 to 110. A voltage between the first pair of terminals, referring to the cathode 106 and the reference terminal 110, is adjustable and depends on the values of the components between the terminals. A resistor coupling 130 of at least two resistor units is coupled between the first pair of terminals. This and other resistor units mentioned in this application comprise at least one resistor. The resistor coupling 130 is coupled to a component arrangement 114 of at least one component having a known temperature dependency of voltage wherein the component having a known temperature dependency may be a semiconductor or a temperature dependent resistor. In this example, there is a series coupling of a series resistor unit $R_d$ 112 and a semiconductor component (relating to the component arrangement 114) coupled in parallel with a parallel resistor unit $R_p$ 116 between the cathode 106 and the reference terminal 110. The order of the components in the series coupling is free. The semiconductor component can be a forward biased diode or a bipolar junction transistor (NPN) whose base and collector are coupled together. For instance, the voltage $V_d$ over a forward biased diode depends on temperature and it can be approximated as:

$$V_d = V_{d0} + (T - T_0) dV/dT, \quad (1)$$

where $V_{d0}$ is a voltage over the diode at a nominal temperature $T_0$ and $dV/dT$ is a coefficient defining a change in voltage when the temperature changes. In general, a voltage over certain pair of terminals of a temperature dependent component or combination of temperature dependent components can be approximated in a similar manner.

A thermally stable reference voltage is formed over a reference resistor $R_r$ 118 between the second pair of terminals, referring to the anode 108 of the voltage regulator and the reference terminal 110. As the reference voltage is constant, the value of the reference resistor 116 defines the current flowing through the reference resistor 116.

A positive terminal 120 of the temperature compensating circuit which is in the same potential as the cathode 106 of the temperature dependent component 104 can provide an amplifier 124 with a positive output voltage. This can be the gate voltage $V_{gate}$ of a FET (Field Effect Transistor). The drain voltage $V_{dd}$ can be taken straight from the power source 100 as shown in FIG. 2A. A negative output voltage can be coupled to the amplifier 124 from a negative terminal 122 which is in the same potential as the anode 108 of the temperature dependent component.

The output voltage $V_{out(1)}$ between the positive output terminal 120 and the negative output terminal 122 can be expressed as:

$$V_{out(1)} = \frac{R_p}{R_p + R_d}\left(\frac{dV}{dT}\right)T + \qquad (2)$$

$$\frac{V_{ref}R_dR_r + R_pR_rV_{ref} + R_pR_rV_{d0} - R_pR_r\left(\frac{dV}{dT}\right)T_0 + V_{ref}R_pR_d}{R_r(R_d + R_p)}$$

As can be noticed, only the first term $$\frac{R_p}{R_p + R_d}\left(\frac{dV}{dT}\right)T$$

has a temperature dependency, the second term being constant with respect to the temperature. The alternative output voltage $V_{out(2)}$ between the positive output terminal 120 and the reference terminal 110 can be expressed as:

$$V_{out(2)} = V_{out(1)} - V_{ref} \qquad (3)$$

This is true because the output voltage $V_{out(1)}$ is a combination of the reference voltage and the adjustable voltage. The alternative output voltage $V_{out(2)}$ naturally has the same temperature dependent term $$\frac{R_p}{R_p + R_d}\left(\frac{dV}{dT}\right)T$$

as in the equation (2). The resistor units $R_d$ 112 and $R_p$ 116 in the resistor coupling 130 form a slope coefficient $$s = \frac{R_p}{R_p + R_d}$$

which is a ratio of values of the resistors in the resistor coupling. The slope can be changed by changing the values of the resistors. One of the resistor units can also have a constant value. Thus, the value of only one resistor unit needs to be varied. This can take place by selecting a suitable resistor or by adjusting the resistor.

As an example, consider some typical values: $V_{d0}=0.3V$, $T_0=25°$ C., $dV/dT=-0.0022V/°$ C.$=-2.2$ mV/° C., $V_{ref}=$ 2.5V. Assume that a slope of $-0.5$ mV/° C. is desired. If the resistor unit $R_p$ is $R_p=10$ kΩ, the resistor unit $R_d$ becomes $R_d=34$ kΩ. Thus, the slope coefficient s is $$s = \frac{R_p}{R_p + R_d} \approx 0.227.$$

Clearly, the slope in the output voltage $$\frac{R_p}{R_p + R_d}\left(\frac{dV}{dT}\right)$$

is independent of the output voltage $V_{out(1)}$ (or $V_{out(2)}$). On the other hand, the output voltage $V_{out(1)}$ (or $V_{out(2)}$) depends on the value of the reference resistor unit $R_r$ 118. Hence, according to equation (2) the output voltage $V_{out(1)}$ can be expressed as:

$$V_{out(1)} = (-0.5 \text{ mV/° C.})T + \frac{0.227(11.255R_r + 85000)}{R_r}.$$

Assuming that the output voltage needs to be 3.8V, the value for the reference resistor unit $R_r$ 118 becomes=15682 Ω.

As it is apparent from the equation (2), the maximum slope obtainable is that of the temperature dependent component 114 used. For a silicon diode the slope is typically about $-2$ mV/° C. Higher slopes can be achieved by using a plurality of temperature dependent components in series. This increases the slope $$\left(\frac{dV}{dT}\right)_{total}$$

as sum of slopes of the components:

$$\left(\frac{dV}{dT}\right)_{total} = \sum_{i=1}^{N+1}\left(\frac{dV}{dT}\right)_i, \qquad (4)$$

where N is the number of the temperature dependent components. In a similar manner the output voltage is dependent on the number of the threshold voltages of the temperature dependent component. Hence, the second term of the equation becomes $$\frac{V_{ref}R_dR_r + R_pR_rV_{ref} + R_pR_rV_{d0} - R_pR_r\sum_{i=1}^{N+1}\left(\frac{dV}{dT}\right)_iT_0 + V_{ref}R_pR_d}{R_r(R_d + R_p)}.$$

If the temperature dependent components are similar, the combined slope is a linear function of the number of the temperature dependent components and can simply be expressed as $$\left(\frac{dV}{dT}\right)_{total} = \sum_{i=1}^{N+1}\left(\frac{dV}{dT}\right)_i = N\left(\frac{dV}{dT}\right).$$

In a similar manner, the second term of the equation can then be expressed as $$\frac{V_{ref}R_dR_r + R_pR_rV_{ref} + R_pR_rV_{d0} - R_pR_rN\left(\frac{dV}{dT}\right)T_0 + V_{ref}R_pR_d}{R_r(R_d + R_p)}.$$

Figure 2B:
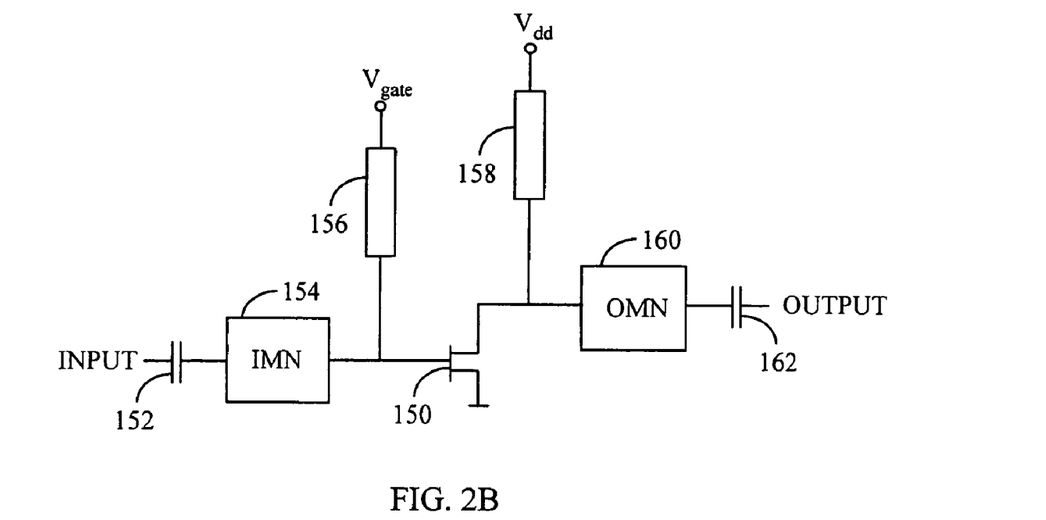
FIG. 2B illustrates an amplifier.

FIG. 2B shows a circuit 170 of an amplifier 150. The input signal may be fed through a capacitor 152 and an input-matching network 154 to the amplifying component 150 which may be a FET (Field Effect Transistor). The input matching network 154 matches the impedances between the signal source and the amplifying component. The gate of the FET may be coupled to a gate voltage $V_{gate}$ formed by the temperature compensating circuit through a resistor, coil or a transmission line 156 proving proper impedance. The source may be connected to ground and the drain may be coupled to operational voltage $V_{dd}$ through a coil or a transmission line 158 having proper impedance. The output of the amplifier, i.e. drain, may be coupled to output matching network 160 which provides the output signal through a capacitor 162. The output-matching network 160 transforms the external amplifier load impedance to a level suitable for the amplifying component.

Figure 3:
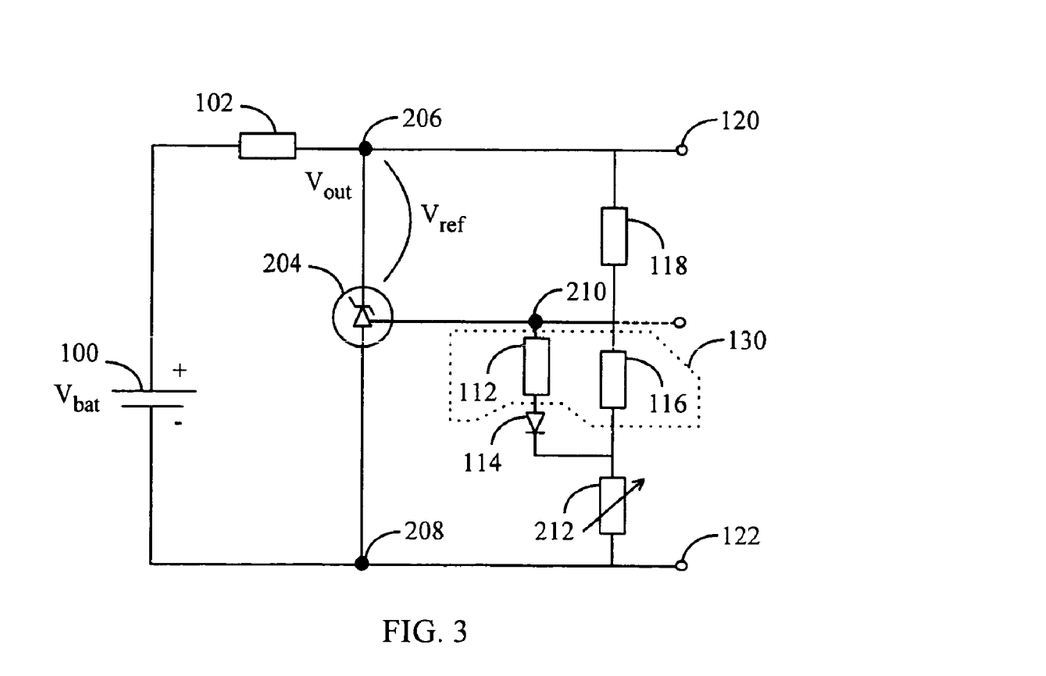
FIG. 3 illustrates an embodiment of a temperature compensating circuit.

With reference to FIG. 3, consider another example of a temperature compensating circuit. This circuit is basically similar to FIG. 2A except that a different kind of voltage regulator, such as LM4041-ADJ or the like, is used. Another difference is the use of an adjustable resistor unit $R_{epot}$ 212. The resistor unit 212 may be mechanically or electronically adjustable. In this case, the reference voltage $V_{ref}$ is formed between the cathode 206 (positive terminal 120 of the circuit) and the reference terminal 210, and the adjustable voltage is formed between the reference terminal 210 and the anode 208 (negative terminal 122 of the circuit). In this case the output voltage can be expressed as:

$$V_{out(1)} = \frac{R_p}{R_p + R_d}\left(\frac{dV}{dT}\right)_{total} T + $$

$$\frac{V_{ref} R_d R_r + R_p R_r V_{ref} + R_p R_r V_{d0} - R_p R_r \left(\frac{dV}{dT}\right)_{total} T_0 + V_{ref} R_p R_d}{R_r(R_d + R_p)} + \frac{V_{ref} R_d R_{repot} + R_p R_{repot} V_{ref}}{R_r(R_d + R_p)},$$

(5)

where the first term $$\frac{R_p}{R_p + R_d}\left(\frac{dV}{dT}\right)_{total} T$$

is temperature dependent and the two other terms are independent of the temperature. The slope coefficient s is $$s = \frac{R_p}{R_p + R_d}.$$

Similarly to equation (3), the output voltage $V_{out(2)}$ between the reference terminal 210 and the negative output terminal 122 can be expressed as $V_{out(2)} = V_{out(1)} - V_{ref}$, where the reference voltage $V_{ref}$ has no effect on the slope. The slope can be controlled by the selection of the resistor units $R_p$ and $R_d$. Independent of the slope, the range of the output voltage can be adjusted by the adjustable resistor unit $R_{epot}$ 212 which may include an adjustable potentiometer. The potentiometer may be an electrically controlled potentiometer.

Assume the following: $V_{out\_max}$=4.0V, $V_{out\_min}$=2.5V, nominal slope $dV/dT_0$=−1.888 mV/° C., nominal temperature $T_0$=25° C. and the number of temperature dependent components N=2. This results in the following calculated values: $R_d$=15690 Ω, $R_p$=11790 Ω, $R_r$=8220 Ω. According to the results the following can be selected: $R_{epot}$=0 to 10 kΩ, $R_r$=8200 Ω, $R_p$=12 kΩ and $R_d$=15.1 kΩ. The selected values result in the following performance: $V_{out\_max}$= 4.006V, $V_{out\_min}$=2.503V, slope $dV/dT$=−1.948 mV/° C.

Figure 4:
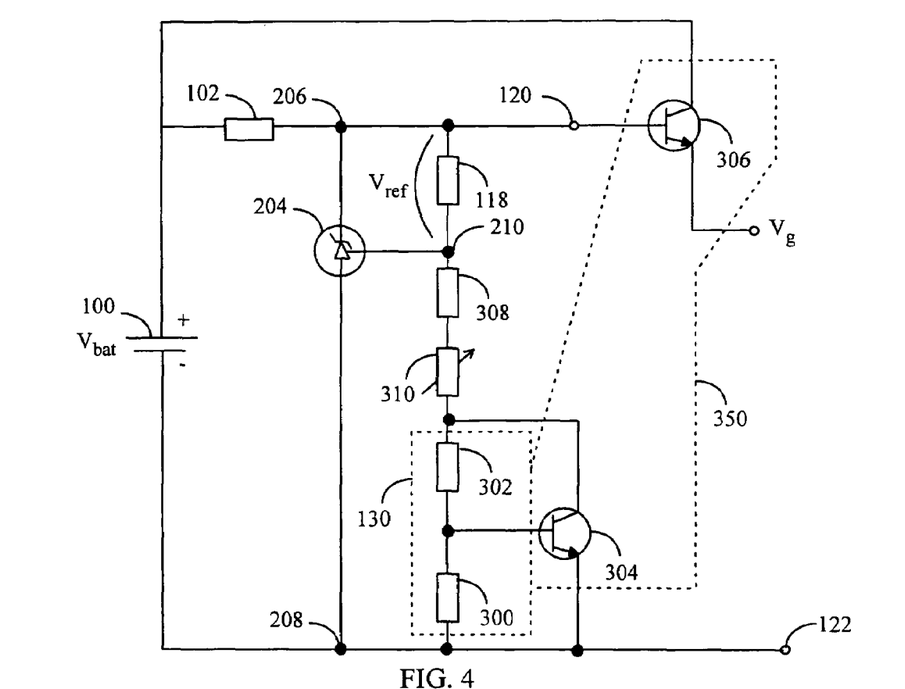
FIG. 4 illustrates an embodiment of a temperature compensating circuit.

Consider still another example of a temperature compensating circuit shown in FIG. 4. In this example the voltage regulator 204 may be LM4041-ADJ or the like. This circuit is basically similar to FIG. 3 except that the temperature dependent components and the resistor coupling 130 differ from that in FIG. 3. The component arrangement 350 of at least one component having a known temperature dependency of voltage may comprise NPN bipolar junction transistors Q1 304 and Q2 306. The resistor coupling 130 may comprise resistor units R1 300 R2 302 which are coupled to the transistor Q1 304. The reference voltage $V_{ref}$ is formed over the reference resistor unit 118 between the cathode of the voltage regulator 204 and the reference terminal 210.

The adjustable voltage, which in this example depends on the values of the limiting resistor unit 308, the adjustable resistor unit 310, the transistor Q1 300 and the resistor coupling 130, is formed between the reference terminal 210 and the anode 208 of the voltage regulator 204.

Assume a simple temperature dependency of the transistor base voltage $V_{be}$ for the transistors Q1 and Q2

$$V_{be} = V_{be}^{nom} + (T - T_0) dV_{be}/dT, \quad (6)$$

where $V_{be}^{nom}$ means the voltage between the base and the emitter at the nominal temperature $T_0$ and $dV_{be}/dT$ is a coefficient defining a change in voltage when the temperature changes. The node voltage $V_b$ at the base of the transistor Q1 can be expressed as:

$$V_b = \frac{V_c - V_{be}^{nom} - (T - T_0) dV/dT}{R_2} \quad (7)$$

$$= \frac{V_{be}^{nom} + (T - T_0) dV/dT}{R_1} + \frac{I_c}{\beta},$$

where $I_c$ is a collector current and $\beta$ is a current gain. The collector current can be determined as $$I_c = \frac{I_{ref} R_2 - V_c + V_{be}^{nom} + (T - T_0) dV_{be}/dT}{R_2} \quad (8)$$

Assuming the current gain $\beta$ is large (for example $\beta$= 50 ... 100) as is the usual case, replacing $I_c$ in (7) with (8) and solving for the collector voltage $V_c$ results in $$V_c = \frac{(R_1 dV_{be}/dT + R_2 dV_{be}/dT)T}{R_1} + \quad (9)$$

$$\frac{R_1 V_{be}^{nom} - T_0 R_2 dV_{be}/dT - T_0 R_1 dV_{be}/dT + R_2 V_{be}^{nom}}{R_1}$$

As the reference resistor unit 118 determines the current flowing between the reference terminal 210 and the negative output terminal 122, the output voltage $V_{out(1)}$ can be expressed as $$V_{out(1)} = \frac{(R_1 dV_{be}/dT + R_2 dV_{be}/dT)T}{R_1} + \quad (10)$$

-continued $$\frac{R_1 V_{be}^{nom} - T_0 R_2 dV_{be}/dT - T_0 R_1 dV_{be}/dT + R_2 V_{be}^{nom}}{R_1} +$$

$$\frac{V_{ref}(R_3 + R_{epot})}{R_{ref}} + V_{ref}$$

The temperature slope dV/dT of the output voltage $V_{out(1)}$ in the first term is $$dV/dT = \frac{(R_1 + R_2)}{R_1} dV_{be}/dT.$$

Although the transistor Q2 306 is not necessary in principle, the output voltage is "pushed and pulled" without it by the input signal and that may cause linearity defects. The output voltage $V_g$ of the transistor Q2 306 can be expressed as $$V_g = \frac{(R_1 dV_{be}/dT + R_2 dV_{be}/dT)T}{R_1} + \quad (11)$$

$$\frac{R_1 V_{be}^{nom} - T_0 R_2 dV_{be}/dT - T_0 R_1 dV_{be}/dT + R_2 V_{be}^{nom}}{R_1} +$$

$$\frac{V_{ref}(R_3 + R_{epot})}{R_{ref}} + V_{ref} - V_{be}^{nom} - (T - T_0)dV_{be}/dT$$

Similarly to earlier examples, the first term $$\frac{(R_1 dV_{be}/dT + R_2 dV_{be}/dT)T}{R_1}$$

has a temperature dependency, the other terms being constant with respect to the temperature. The resistor coupling 130 determines the slope coefficient $$s = \frac{R_2}{R_1}.$$

The function of the limiting resistor unit $R_3$ 308 is to restrict the range of adjustment made by the adjusting resistor unit $R_{epot}$ 310. The resistor unit 310 may be mechanically or electronically adjustable. In this way the adjusting resistor unit $R_{epot}$ 310 can be used in fine-tuning the level of the output voltage.

As an example, assume the following component values: $V_{ref}$=1.1V, $V_{be}$=0.65V, $dV_{be}/dT$=−2 mV/° C. Assume now the following design targets of the temperature compensating circuit: $V_{g\_min}$=2.5V, $V_{g\_max}$=4.0V, dV/dT=−1.8 mV/° C. and $R_{epot}$=0 to 10 kΩ. For the resistor unit $R_1$ 300 a convenient value of 1 kΩ can be selected. This results in calculated values $R_3$=5433 Ω, $R_{ref}$=7333 Ω, $R_2$=900 Ω. Instead of the calculated values, the standard components can be selected as follows $R_3$=4700 Ω, $R_{ref}$=6800 Ω, $R_2$=910 Ω with which the temperature slope dV/dT becomes dV/dT=−1.82 mV/° C.

Figure 5:
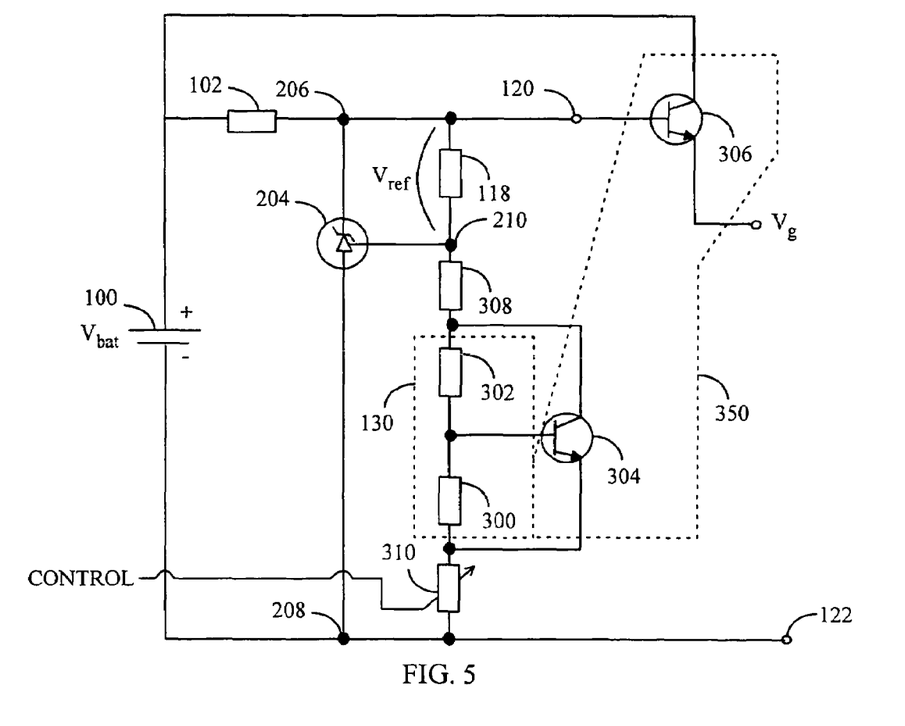
FIG. 5 illustrates an embodiment of a temperature compensating circuit.

FIG. 5 illustrates a circuit version that is different from the one in FIG. 4. Although in FIG. 5 the adjusting resistor unit $R_{epot}$ 310 is coupled between the resistor 300 and ground instead of coupling it between the resistor 302 and the resistor 308 in FIG. 4, the effective operation of the circuits in FIGS. 4 and 5 is the same.

Figure 6:
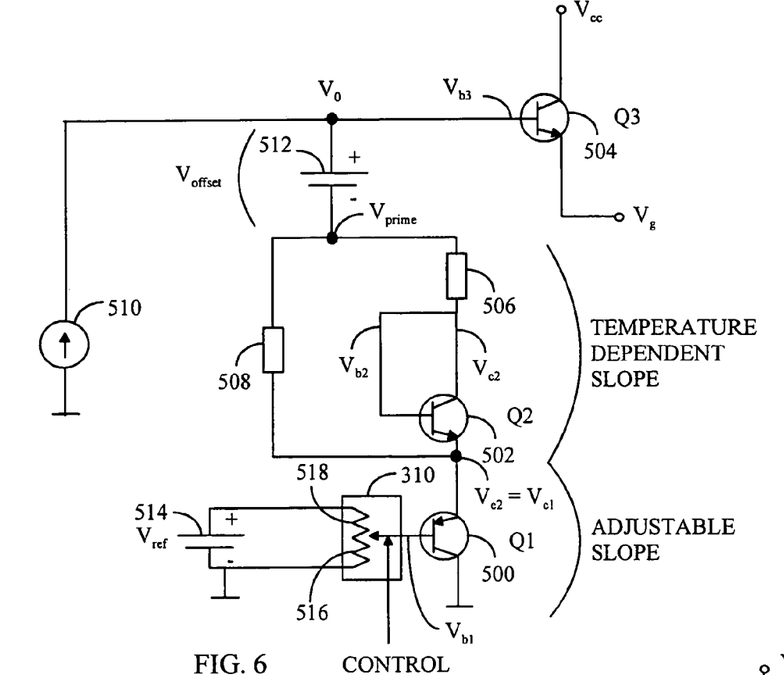
FIG. 6 illustrates an embodiment of a temperature compensating circuit.

FIG. 6 illustrates a circuit similar to that in FIGS. 4 and 5. Because of a possibly worse end-to-end resistance temperature stability of the electronically adjustable potentiometer compared to a mechanically adjustable potentiometer, a revised design may be more suitable. Consider the following circuit where an electronically adjustable potentiometer 310 is used to scale a fixed voltage reference 514. Because of the voltage reference, variations in the end-to-end resistance will have no impact. Only the differential variation in the resistor chain of the electronically adjustable potentiometer will impact the voltage. The voltage developed by the electronically adjustable potentiometer is applied to the base of a PNP transistor Q1 500 which is used as a voltage follower. A transistor Q2 502 is connected to behave like a diode that would be identical to the b-e junction of the transistor Q3 504. Appropriate combinations of resistor units $R_{cs}$ 506 and $R_{cp}$ 508 allow setting the temperature slope from zero to that of a single b-e junction. Note that the temperature slopes of the transistors Q1 and Q3 should at least approximately cancel each other. Finally, a constant current source 510 is employed to maintain the slopes and current gains of the transistors. A voltage regulator such as the LM4041-ADJ can be employed and it generates an offset voltage 512 in the process.

Assume simple temperature dependence for the transistor base-emitter saturation voltage $$V_{be\_sat} = V_{be\_nom} + (T - T_0)dV/dT, \quad (12)$$

Start with the Thevenin equivalent voltage source to find the emitter voltage of the transistor Q1. Model the electronically adjustable potentiometer as two resistors with k_pot defining the "tap" setting. The temperature coefficient of resistance (TCR) is broken into a common TCR to describe the change in the end-to-end resistance over temperature and a differential TCR to describe how well the two resistors track to each other. The resistors $R_{lo}$ 516 and $R_{hi}$ 518 can be expressed as $$R_{lo} = R_{epot} k_{pot}[1 + (TCR_c + TCR_d/2)(T - T_0)], \quad (13)$$

$$R_{hi} = R_{epot}(1 - k_{pot})[1 + (TCR_c - TCR_d/2)(T - T_0)], \quad (14)$$

where $TCR_c$ denotes common TCR, $TCR_d$ denotes differential TCR and $k_{pot}$ is a real number from 0 to 1 which would represent the position of the wiper in a mechanical analogy to the electronic potentiometer. The base current can be deduced from the collector emitter current. The latter is forced by the current source, $I_{bias}$, used to generate the fixed voltage offset. For convenience, use the Thevenin equivalent of the resistance of the electronically adjustable potentiometer and the reference voltage as follows $$R_{thev} = 1/(1/R_{lo} + 1/R_{hi}) = R_{lo} R_{hi}/(R_{lo} + R_{hi}), \quad (15)$$

$$V_{thev} = V_{ref} R_{lo}/(R_{lo} + R_{hi}) \quad (16)$$

The base voltage of the transistor Q1 can now be expressed as $$V_{b1} = V_{thev} + (R_{thev} I_{bias})/\beta \approx V_{thev}, \quad (17)$$

Because the current gain β is usually large the second term in (17) can be omitted resulting in approximate equality of $V_{b1}$ and $V_{thev}$.

This leads to the emitter voltage $V_{e1}$ of the transistor Q1

$$V_{e1} = V_{e2} = V_{b1} + V_{be\_sat}, \quad (18)$$

The base voltage of the transistor Q2 can be expressed as $$V_{b2}=V_{c1}+V_{be\_sat}, \quad (19)$$

The nodal equation at the junction of $R_{cs}/R_{cp}$ may be written in term of the voltage at the node, $V_{prime}$ $$(V_{prime}-V_{b2})/R_{cs}+(V_{prime}-V_{c1})/R_{cp}=I_{bias}, \quad (20)$$

and then solved for $V_{prime}=V_0-V_{offset}$ $$V_{prime}=I_{bias}(R_{cp}R_{cs}/(R_{cs}+R_{cp}))+(R_{cp}V_{b2}+R_{cs}V_{c1})/(R_{cp}+R_{cs}), \quad (21)$$

The base voltage of the transistor Q3, in turn, can be determined as $$V_{b3}=V_0=V_{prime}+V_{offset}, \quad (22)$$

which leads to the voltage $V_{gate}$ that would be applied to the gate of the LDMOS device $$V_{gate}=V_{b3}-V_{be\_sat}=I_{bias}(R_{cp}R_{cs}/(R_{cs}+R_{cp}))+(R_{cp}V_{b2}+R_{cs}V_{c1})/(R_{cp}+R_{cs})-V_{be\_sat}, \quad (23)$$

As a result, the temperature slope at the nominal temperature $T_0$ can be expressed as ($\beta$ is assumed large)

$$\frac{\partial V_{gate}}{\partial T_{nom}} = \left(\frac{\partial V_{be}}{\partial T}R_{cp} + ADD1 + ADD2 + ADD3 + ADD4\right)\bigg/ DENOM, \quad (24)$$

where $DENOM=R_{cp}+R_{cs}$, $ADD1=R_{cp}V_{ref}k_{pot}TCR_d$, $ADD2=R_{cs}V_{ref}k_{pot}TCR_d$, $ADD3=R_{cp}V_{ref}k_{pot}^2TCR_d$, and $ADD4=-R_{cs}V_{ref}k_{pot}^2TCR_d$.

In order to solve for the component values needed in the power amplifier circuit, start with the known constants. Assume a generic transistor with $V_{be\_nom}=0.65V$, $dV_{be}/dT=-2$ mV/° C., $\beta=50$. Additionally, assume the following design targets $V_{g\_min}=2.5V$, $v_{g\_max}=4.0V$, s=−1.8 mV/° C., $I_{bias}=1$ mA and $V_{ref}=1.225V$ and specifications of the electrically adjustable potentiometer $R_{epot}=10$ kΩ, $N_{steps}=256$, $V_{offset}$ 1.1V, $TRC_c=0.00075°$ C./kΩ, $TRC_d=0.00003°$ C./Ω. With these assumptions the following components can be selected: $R_{cp}=12$ kΩ and $R_{cs}=1$ kΩ. The temperature slope s becomes s=−1.846 mV/° C. at the minimum, s=−1.799 mV/° C. at the middle and s=1.846 mV/° C. at the maximum settings of the electrically adjustable potentiometer. The slope variation can be considered constant with respect to the settings from a practical point of view.

The value of resistance of the electronically adjustable potentiometer and hence the nominal voltage can be adjusted not only during manufacturing of a device but also during every day use of the device. For example, aging of the temperature dependent components can be taken into account and the bias voltage can be adapted to the changes in the temperature dependence. This can be performed by changing the voltage as a function of time or some other measurable performance metric. Another possibility is to measure or otherwise determine change in the slope of the amplifying component and adapt the slope formed by the temperature compensating to the change.

Figure 7:
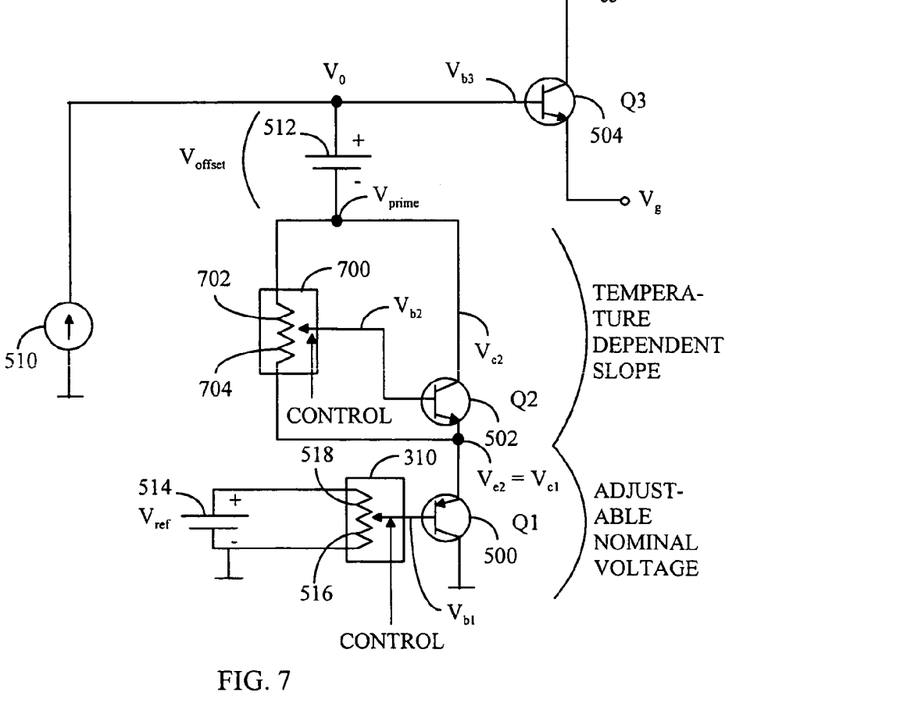
FIG. 7 illustrates an embodiment of a temperature compensating circuit.

FIG. 7 shows a circuit with a changeable voltage and temperature slope. In FIG. 7 the circuit is otherwise similar to the circuit in FIG. 6 except that the resistor units 506, 508 have been replaced with an adjustable potentiometer 700 to provide an adjustable slope mechanism. Hence, the resistor coupling includes an adjustable potentiometer for adjusting the slope coefficient and the adjustable potentiometer provides the temperature compensating circuit with an output voltage having a temperature dependency which is an adjustable function of the slope coefficient and the known temperature dependency of at least one component in the component arrangement 114. The potentiometer 700 can be a mechanically adjustable potentiometer or an electronically adjustable potentiometer (similar to the potentiometer 310 in FIG. 6). A resistor 702 having a value $k \cdot R_{pot}$ can be considered to correspond to the resistor unit 506, where $R_{pot}$ is the total resistance of the potentiometer and k is a real number from 0 to 1. In a similar manner a resistor 704 having a value $i \cdot R_{pot}$ can be considered to correspond to the resistor unit 508, where i is a real number from 0 to 1 such that k=1−i. It is also possible that the adjustable potentiometer 700 substitutes for only one of the resistor units 506, 508.

The amplifier can also be switched off when there is no input signal to the amplifier. This can be accomplished by setting the minimum output voltage of the temperature compensating circuit below a threshold of the amplifying component. For example, if the gate voltage of a LDMOS (Laterally Diffused Metal Oxide Semiconductor) transistor, which can be used as an amplifying component, is dropped below a certain threshold voltage determined by the manufacturer, no current can flow between the drain and the source and hence the component can be switched off.

Figure 8:
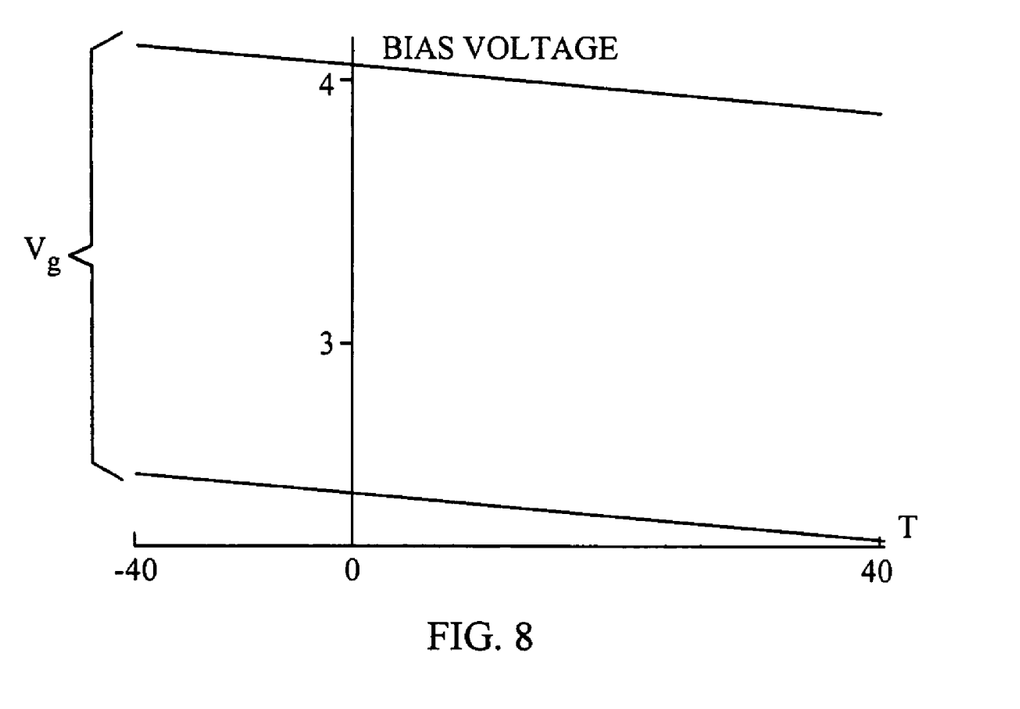
FIG. 8 illustrates performance of the circuit.

FIG. 8 shows the operation of the temperature compensating circuit of FIGS. 4, 5 and its example. The output voltage $V_g$ has the slope s=−1.82 mV/° C. and the level of the output voltage can be controlled independently of the slope between 2.5V and 4.0V. The slope can vary substantially such that, for example, a range of −1.5 mV/° C. to −4.0 mV/° C. may be needed.

The voltage regulator may be any type of circuit that functions as a voltage comparator against a temperature compensated reference. The voltage regulator may be an integrated or a discrete device having at least three terminals.

Even though the invention is described above with reference to examples according to the accompanying drawings, it is clear that the invention is not restricted thereto but can be modified in several ways within the scope of the appended claims.

The invention claimed is:

1. A temperature compensating circuit for an amplifier, the circuit comprising:

a voltage regulator having at least three terminals, a voltage between a first pair of terminals being adjustable and a reference voltage between a second pair of terminals being thermally stable, and at least part of the output voltage of the temperature compensating circuit being provided from the first pair of terminals;

a component arrangement including at least one component with a known temperature dependency of voltage, the at least one component with a known temperature dependency being coupled between the first pair of terminals of the voltage regulator;

a resistor coupling of at least two resistor units for forming a slope coefficient as a ratio of values of the resistors in the resistor coupling, each of the resistor units including at least one resistor, and the resistor coupling is coupled to the at least one component having a known temperature dependency and being coupled between the first pair of terminals of the voltage regulator for providing the temperature compensating circuit with an output voltage having a temperature dependency which is a function of the slope coefficient and the known temperature dependency of the at least one component in the component arrangement, wherein an adjustable resistor unit is coupled between the first pair of terminals for providing an adjustable output voltage independent of the temperature dependency, the adjustable resistor unit including at least one resistor, wherein the adjustable resistor unit is an electronically adjustable resistor unit.

2. A temperature compensating circuit for an amplifier, the circuit comprising:

a voltage regulator having at least three terminals, a voltage between a first pair of terminals being adjustable and a reference voltage between a second pair of terminals being thermally stable, and at least part of the output voltage of the temperature compensating circuit being provided from the first pair of terminals;

a component arrangement including at least one component with a known temperature dependency of voltage the at least one component with a known temperature dependency being coupled between the first pair of terminals of the voltage regulator;

a resistor coupling of at least two resistor units for forming a slope coefficient as a ratio of values of the resistors in the resistor coupling, each of the resistor units including at least one resistor, and the resistor coupling is coupled to the at least one component having a known temperature dependency and being coupled between the first pair of terminals of the voltage regulator for providing the temperature compensating circuit with an output voltage having a temperature dependency which is a function of the slope coefficient and the known temperature dependency of the at least one component in the component arrangement, wherein a transistor is coupled between the first pair of terminals, an electronically adjustable resistor unit is coupled to the base of the transistor, a constant voltage is coupled to the electronically adjustable resistor unit, and the electronically adjustable resistor unit is configured to adjust the voltage fed to the base of the transistor for providing an adjustable output voltage independent of the temperature dependency.

3. The circuit of claim 2, wherein the electronically adjustable resistor unit is configured to adjust the adjustable output voltage below a threshold voltage of the amplifier in order to switch off the amplifier when no input signal is fed to the amplifier.

4. A temperature compensating circuit for an amplifier, the circuit comprising:

a voltage regulator having at least three terminals, a voltage between a first pair of terminals being adjustable and a reference voltage between a second pair of terminals being thermally stable, and at least part of the output voltage of the temperature compensating circuit being provided from the first pair of terminals;

a component arrangement including at least one component with a known temperature dependency of voltage, the at least one component with a known temperature dependency being coupled between the first pair of terminals of the voltage regulator;

a resistor coupling of at least two resistor units for forming a slope coefficient as a ratio of values of the resistors in the resistor coupling, each of the resistor units including at least one resistor, and the resistor coupling is coupled to the at least one component having a known temperature dependency and being coupled between the first pair of terminals of the voltage regulator for providing the temperature compensating circuit with an output voltage having a temperature dependency which is a function of the slope coefficient and the known temperature dependency of the at least one component in the component arrangement, wherein the resistor coupling includes an adjustable potentiometer for adjusting the slope coefficient, the adjustable potentiometer providing the temperature compensating circuit with an output voltage having a temperature dependency which is an adjustable function of the slope coefficient and the known temperature dependency of the at least one component in the component arrangement.

5. An amplifier including a temperature compensating circuit, the temperature compensating circuit comprising:

a voltage regulator having at least three terminals, a voltage between a first pair of terminals being adjustable and a reference voltage between a second pair of terminals being thermally stable, and at least part of the output voltage of the temperature compensating circuit being provided from the first pair of terminals;

a component arrangement including at least one component with a known temperature dependency of voltage, the at least one component with a known temperature dependency being coupled between the first pair of terminals of the voltage regulator;

a resistor coupling of at least two resistor units for forming a slope coefficient as a ratio of values of the resistors in the resistor coupling, each of the resistor units including at least one resistor, and the resistor coupling is coupled to the at least one component having a known temperature dependency and being coupled between the first pair of terminals of the voltage regulator for providing the temperature compensating circuit with an output voltage having a temperature dependency which is a function of the slope coefficient and the known temperature dependency of the at least one component in the component arrangement.

6. A transmitter including an amplifier with a temperature compensating circuit, the temperature compensating circuit of the transmitter comprising:

a voltage regulator having at least three terminals, a voltage between a first pair of terminals being adjustable and a reference voltage between a second pair of terminals being thermally stable, and at least part of the output voltage of the temperature compensating circuit being provided from the first pair of terminals;

a component arrangement including at least one component with a known temperature dependency of voltage, the at least one component with a known temperature dependency being coupled between the first pair of terminals of the voltage regulator;

a resistor coupling of at least two resistor units for forming a slope coefficient as a ratio of values of the resistors in the resistor coupling, each of the resistor units including at least one resistor, and the resistor coupling is coupled to the at least one component having a known temperature dependency and being coupled between the first pair of terminals of the voltage regulator for providing the temperature compensating circuit with an output voltage having a temperature dependency which is a function of the slope coefficient and the known temperature dependency of the at least one component in the component arrangement.

7. A base station including an amplifier with a temperature compensating circuit, the temperature compensating circuit of the base station comprising:
a voltage regulator having at least three terminals, a voltage between a first pair of terminals being adjustable and a reference voltage between a second pair of terminals being thermally stable, and at least part of the output voltage of the temperature compensating circuit being provided from the first pair of terminals;
a component arrangement including at least one component with a known temperature dependency of voltage, the at least one component with a known temperature dependency being coupled between the first pair of terminals of the voltage regulator;
a resistor coupling of at least two resistor units for forming a slope coefficient as a ratio of values of the resistors in the resistor coupling, each of the resistor units including at least one resistor, and
the resistor coupling is coupled to the at least one component having a known temperature dependency and being coupled between the first pair of terminals of the voltage regulator for providing the temperature compensating circuit with an output voltage having a temperature dependency which is a function of the slope coefficient and the known temperature dependency of the at least one component in the component arrangement.

8. A user terminal including an amplifier with a temperature compensating circuit, the temperature compensating circuit of the user terminal comprising:
a voltage regulator having at least three terminals, a voltage between a first pair of terminals being adjustable and a reference voltage between a second pair of terminals being thermally stable, and at least part of the output voltage of the temperature compensating circuit being provided from the first pair of terminals;
a component arrangement including at least one component with a known temperature dependency of voltage, the at least one component with a known temperature dependency being coupled between the first pair of terminals of the voltage regulator;
a resistor coupling of at least two resistor units for forming a slope coefficient as a ratio of values of the resistors in the resistor coupling, each of the resistor units including at least one resistor, and
the resistor coupling is coupled to the at least one component having a known temperature dependency and being coupled between the first pair of terminals of the voltage regulator for providing the temperature compensating circuit with an output voltage having a temperature dependency which is a function of the slope coefficient and the known temperature dependency of the at least one component in the component arrangement.

9. An amplifier including a temperature compensating circuit, the temperature compensating circuit comprising:
means for regulating voltage having at least three terminals, a voltage between a first pair of terminals being adjustable and a reference voltage between a second pair of terminals being thermally stable, and at least part of the output voltage of the temperature compensating circuit being provided from the first pair of terminals;
means for providing a known temperature dependency;
means for forming a slope coefficient; and
the circuit is configured to provide an output voltage having a temperature dependency which is a function of the slope coefficient and the known temperature dependency.

10. A transmitter including an amplifier with a temperature compensating circuit, the temperature compensating circuit of the transmitter comprising:
means for regulating voltage, the means for regulating voltage having at least three terminals, a voltage between a first pair of terminals being adjustable and a reference voltage between a second pair of terminals being thermally stable, and at least part of the output voltage of the temperature compensating circuit being provided from the first pair of terminals;
means for providing a known temperature dependency;
means for forming a slope coefficient; and
the temperature compensating circuit is configured to provide an output voltage having a temperature dependency which is a function of the slope coefficient and the known temperature dependency.

11. A base station including an amplifier with a temperature compensating circuit, the temperature compensating circuit of the base station comprising:
means for regulating voltage, the means for regulating voltage having at least three terminals, a voltage between a first pair of terminals being adjustable and a reference voltage between a second pair of terminals being thermally stable, and at least part of the output voltage of the temperature compensating circuit being provided from the first pair of terminals;
means for providing a known temperature dependency;
means for forming a slope coefficient; and
the temperature compensating circuit is configured to provide an output voltage having a temperature dependency which is a function of the slope coefficient and the known temperature dependency.

12. A user terminal including an amplifier with a temperature compensating circuit, the temperature compensating circuit of the user terminal comprising:
means for regulating voltage, the means for regulating voltage having at least three terminals, a voltage between a first pair of terminals being adjustable and a reference voltage between a second pair of terminals being thermally stable, and at least part of the output voltage of the temperature compensating circuit being provided from the first pair of terminals;
means for providing a known temperature dependency;
means for forming a slope coefficient; and
the temperature compensating circuit is configured to provide an output voltage having a temperature dependency which is a function of the slope coefficient and the known temperature dependency.

* * * * *